(12) United States Patent
Yaniv et al.

(10) Patent No.: US 6,700,454 B2
(45) Date of Patent: Mar. 2, 2004

(54) INTEGRATED RF ARRAY USING CARBON NANOTUBE CATHODES

(76) Inventors: Zvi Yaniv, 5810 Long Ct., Austin, Travis County, TX (US) 78730; Richard Fink, 11406 Bunting Dr., Austin, Travis County, TX (US) 78759; Robert J. Espinosa, 1280 Theresa Ave., Campbell, Santa Clara County, CA (US) 95008

(*) Notice: Subject to any disclaimer, the term of this patent is extended or adjusted under 35 U.S.C. 154(b) by 13 days.

(21) Appl. No.: 10/185,763

(22) Filed: Jun. 27, 2002

(65) Prior Publication Data

US 2003/0034919 A1 Feb. 20, 2003

Related U.S. Application Data

(60) Provisional application No. 60/302,230, filed on Jun. 29, 2001.

(51) Int. Cl.[7] .............................. H01J 23/24; H03B 9/02
(52) U.S. Cl. ............................. 333/1; 315/39.3; 331/82
(58) Field of Search ................................. 313/336, 293; 315/5.29, 39, 39.3; 333/1; 331/81, 82

(56) References Cited

U.S. PATENT DOCUMENTS

| | | | |
|---|---|---|---|
| 3,746,915 A | 7/1973 | Jasper, Jr. et al. | 315/39.3 |
| 3,787,747 A | 1/1974 | Scott | 315/3.5 |
| 3,866,077 A | 2/1975 | Baker et al. | |
| 3,971,966 A | 7/1976 | Gottfried et al. | 315/39.3 |
| 4,272,699 A | 6/1981 | Faubel et al. | |
| 4,728,851 A | 3/1988 | Lambe | |
| 5,319,322 A | 6/1994 | O'Loughlin | 331/81 |
| 5,773,921 A | 6/1998 | Keesmann et al. | |
| 6,097,138 A | 8/2000 | Nakamoto | |
| 6,239,547 B1 | 5/2001 | Uemura et al. | |
| 6,265,466 B1 | 7/2001 | Glatkowski et al. | |
| 6,359,383 B1 | 3/2002 | Chuang et al. | |
| 6,380,671 B1 | 4/2002 | Lee | |
| 2002/0006489 A1 | 1/2002 | Goth et al. | |

FOREIGN PATENT DOCUMENTS

| | | |
|---|---|---|
| EP | 0 905 737 A1 | 3/1999 |
| EP | 0 913 508 A2 | 5/1999 |
| EP | 0 951 047 A2 | 10/1999 |
| EP | 1 047 097 A1 | 10/2000 |
| EP | 1 061 544 A1 | 12/2000 |
| EP | 1 061 555 A1 | 12/2000 |
| EP | 1 073 090 A2 | 1/2001 |
| EP | 1 102 298 A1 | 5/2001 |
| EP | 1 102 299 A1 | 5/2001 |
| JP | 58-216327 | 2/1994 |
| JP | 10-050240 | 2/1998 |
| JP | 9-221309 | 6/1998 |
| JP | 10-199398 | 7/1998 |
| JP | 11-111161 | 4/1999 |
| JP | 11-135042 | 5/1999 |
| JP | 11-260244 | 9/1999 |
| JP | 11-260249 | 9/1999 |
| JP | 11-297245 | 10/1999 |
| JP | 11-329311 | 11/1999 |
| JP | 11-329312 | 11/1999 |
| WO | WO 98/21736 | 5/1998 |

OTHER PUBLICATIONS

K. Konuma et al. "Field–Emitter Array Cathode–Ray Tube (FEA–CRT)," *SID 99 Digest*, 1999, pp. 1150–1153.

Robert J. Espinosa et al. "Applications of Carbon Film Cold Cathodes in Vacuum Electron Devices," International Vacuum Electronics Conference 2000, 3 pages.

(List continued on next page.)

*Primary Examiner*—Don Le
(74) *Attorney, Agent, or Firm*—Kelly K. Kordzik; Winstead Sechrest & Minick P.C.

(57) ABSTRACT

An array of carbon nanotube electron sources to make an integrated array of RF (radio frequency) sources in a single vacuum envelope. The RF sources can be printed circuit traveling wave tubes.

10 Claims, 5 Drawing Sheets

OTHER PUBLICATIONS

Tipyada Thumvongskul et al. "Effect of Plasma Inhomogeneity and Electron–Ion Collisions on Growth Characteristics of a Plasma–Filled Cherenkov Laser," International Vacuum Electronics Conference 2000, 3 pages.

D. R. Whaley et al. "Application of Field Emitter Arrays to Microwave Power Amplifiers," International Vacuum Electronics Conference 2000, 3 pages.

A. Galdetskiy et al. "Electron Gun for Microwave Tubes with Cold Field Emitting Cathodes," International Vacuum Electronics Conference 2000, 3 pages.

V. I. Makhov et al. "Industrial Application of Cold Cathodes Based on Field Emission in Microwave Devices," International Vacuum Electronics Conference 2000, 3 pages.

Chenggang Xie et al. "Current Sensitivity of the Spindt–type Field Emitter," International Vacuum Electronics Conference 2000, 3 pages.

INTEGRATED RF ARRAY USING CARBON NANOTUBE CATHODES

This application claims the benefit of provisional No. 60/302,230 filed on JUN. 29, 2001.

The present invention is subject to a paid-up license to the U.S. Government in accordance with SBIR Contract DASG60-01-0079.

TECHNICAL FIELD

The present invention relates in general to field emission devices, and in particular, to the use of a field emission cathode within a focused microwave beam traveling wave tube.

BACKGROUND INFORMATION

A great deal of effort was put into the design and manufacture of vacuum tube devices in the millimeter wave range: most of this work involved extension of the simple vacuum triode. This approach has inherent limitations in the push to higher frequencies. Slow wave or magnetically confined beam devices all require high magnetic fields for focusing or steering the electron beam. Most of these examples are large and heavy and are thus avoided for space-based and in-flight applications.

Listed below are various RF (radio frequency) amplifier and source technologies:

Electron Bombarded Semiconductor (EBS)

Traveling Wave Tube (TWT)

Pancake (printed circuit) TWT (PTWT), including multibeam

Klystron and Extended Interaction Klystron (EIK)

Semiconductor (only as a baseline)

EBS—EBS combines vacuum and semiconductor technologies and offers high gain and bandwidth. It can be made flat in response from DC to its −3 dB frequency. In examining the technology of EBS from 1948 to the present, in the literature, one can see themes and diagrams repeated but relatively little gain in performance. The fundamental physics of the vacuum triode restricts its use to below 3 GHz, with heroic exceptions to a few GHz above that. It is suitable for an arrayed amplifier structure but not higher frequencies.

Conventional TWT—The traveling wave tube is a mature technology with little to be added by cold cathode technology for many applications. Because cathode heater power is a few percent of overall power consumption, use of CNTs (carbon nanotubes) offers questionable advantage. Tube design is definitely simplified and the elimination of HV-isolated heater supplies is a real benefit. Considering the additional magnetics and support costs, the conventional TWT is not considered seriously here. Their size makes use in an arrayed amplifier structure difficult.

Klystron—The klystron is a mature and well-understood technology, composed of a series of microwave cavities. Above 20 GHz or so, fabrication of the conventional cavity arrangement becomes increasingly difficult and the device physics imposes limitations on available power. For many reasons, the conventional klystron is considered unsuitable for application as an RF array. Included in the Klystron family of devices are the Extended Interaction Klystron (EIK) and the reflex Klystron.

EIK Klystron—The Extended Interaction Klystron becomes more practical above 20 or 30 GHz than a typical klystron. The cavities in an EIK are multiple wavelengths in size, making them physically larger. The wavelength-related mode-enhancing structures in the cavity are still tiny but are simpler to fabricate than are mid-sized cavities. The EIK has beam and focus restrictions that dictate the use of bulky magnetics, however. For a number of reasons, the EIK is also unsuitable for an RF array.

The reflex klystron is a relatively simple and compact oscillator that uses only a single cavity and a repeller or reflector to focus the accelerated electron beam back onto itself through a small gap in the walls of the resonator. Although this concept is largely ignored in current device designs because of poor efficiency and narrow bandwidth, it may have applications in the THz range and for integrated array RF sources because of design simplicity.

Most of these examples are devices that use hot sources of electrons (thermionic cathodes). Some examples of cold cathode microwave devices exist.

The klystrode is a single stage klystron device with beam bunching accomplished by modulating the electron beam intensity from a cold cathode source (D. R. Whaley, B. Gannon, C. R. Smith, and C. A. Spindt, "Application of Field Emitter Array to Microwave Power Amplifiers", Extended Abstracts of the Int. Vacuum Electronics Conf. 2000, May 2–4, 2000, Monterey, Calif., USA, p. 9.1).

RF sources and amplifiers in the 10 GHz range currently exist. Efficiencies of 30%–50% are not unreasonable for power generation of 5–20 Watts. These devices are vacuum tube devices as solid-state technology has yet to compete in performance in this range. There are some cases where arrays of sources are required. For example, phase array sources build up a node of high intensity that can be steered by changing the phase of coherency between each of the sources. The more sources there are in the array, the sharper the node can be. Arrayed sources allow higher power operation with the ability to have large bandwidth and a high degree of redundancy. In other words, if one device in the array fails, the other sources may still operate. This is not true with a single, high power source. They also allow rapid beam steering and tracking not obtainable with mechanical changing of the direction an antenna.

The cost of array devices is presently very high. This is due to the fact that each source in the array is hand made with resulting low yields. This problem is amplified by the fact that often it is not enough that the devices operate, they must operate within tightly matched performance levels.

Efficiency and lifetime are also major concerns, especially for space-based operation due to the limited power available and understandably limited access. Cold cathode sources have been proposed for some time as a means of improving efficiency by eliminating the heater for the hot cathode source. Cold cathodes have also demonstrated high emission current densities that rival some of the best hot cathode sources. Researchers have documented emission current densities from microtip cathodes on the order of 1–15 amps/$cm^2$ (1.2 amps/$cm^2$ at 70V; 12 amps/$cm^2$ at 250V). Despite these results, few examples exist of the marriage between microtip cathodes and microwave devices. The best examples of RF devices and cold cathodes are R&D prototype devices. No RF product exists that includes a microtip cathode. The issues impeding implementation are life of the cathode and its susceptibility to arc damage. Microtip cathodes generally do not die gracefully, but suddenly and unexpectedly. As a result, a large degree of skepticism has developed in the microwave community towards cold cathode technology. In both cases sited earlier, significant efforts were made in the electron gun and microwave device design and fabrication to protect the microtip source from ion feedback and arc damage, widely accepted methods of microtip failure. It is true also that hot cathode sources have limited lifetimes as well, but they are much more graceful and predictable, allowing system designers and operators the opportunity to incorporate redundancy and service schedules. Even if maintenance is not possible such as in a satellite, scheduled failure is much more acceptable than unpredictable failure.

The effort to incorporate microtip cathodes into microwave devices may be a bit misplaced. For many microwave devices, the efficiency of the cathode contributes little to the efficiency of the device. The exception is for small, low power devices and especially for device arrays.

There exists a need to make a phase array microwave device in which the array elements are fully integrated into a single device.

BRIEF DESCRIPTION OF THE DRAWINGS

A better understanding of the present invention can be obtained when the following detailed description is considered in conjunction with the following drawings, in which.

DETAILED DESCRIPTION

Figure 1:
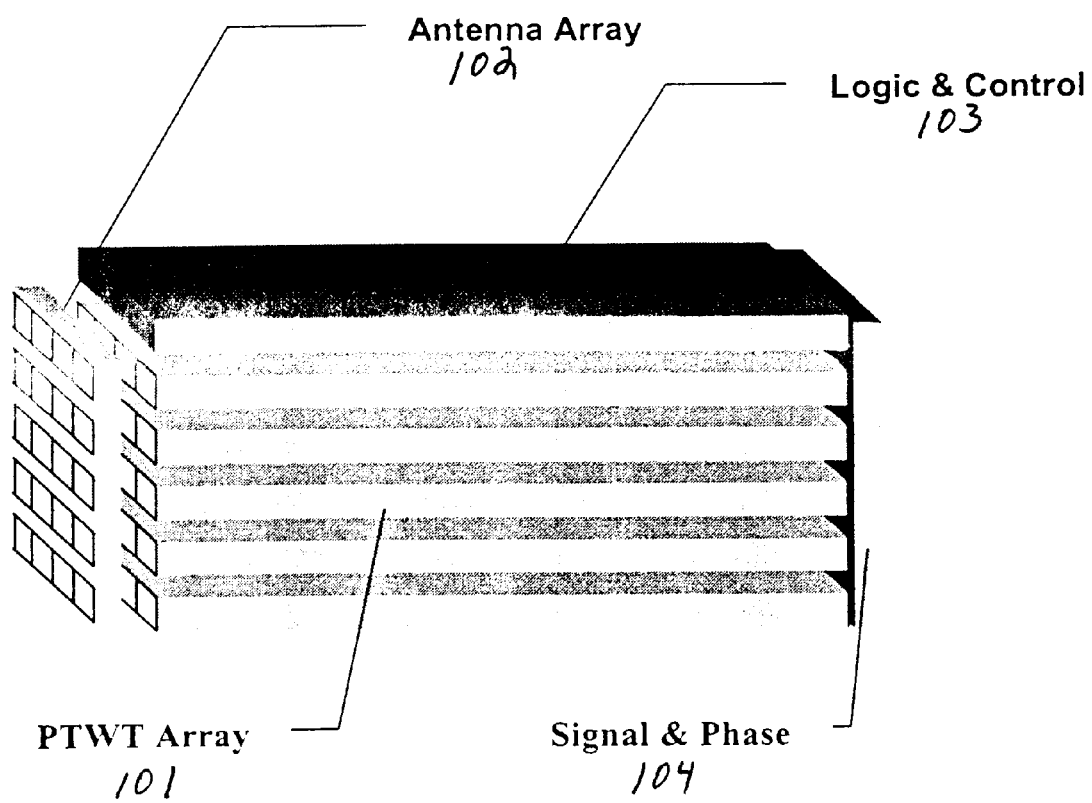
FIGS. 1–6 illustrate embodiments of the present invention.

The ability to pattern the cathode, available for both microtip and carbon films, now allows a fully integrated array device.

This has many advantages:

Fully integrated arrays will led to lower cost array sources as assembly costs decrease and yields improve.

Array devices lead to higher power sources with the power distributed over many smaller sources. Depending on the design, the bandwidth of an array device can be quite large.

Distributed sources leads also to a more robust device as operation is not dependent on a single source.

Distributed power leads to lower local heating, decreasing gas generation and ion feedback.

Moreover, cold cathodes allow for tighter assembly of the RF arrays, which is not possible with nor obvious in view of hot cathodes. For higher frequencies above 3 GHz, the components of the RF array as described below must be smaller. However, since a hot cathode radiates in all directions, it is not possible to focus sufficient numbers of emitted electrons in the optimal direction to obtain an adequate output signal. Since cold cathodes can be caused to emit a finely focused beam of electrons, higher frequency arrays can now be possible.

The inventors have developed a carbon nanotube (CNT) cold-cathode material. It has demonstrated the use as an electron beam source in configurations that include both single-beam and arrays of beams.

The invention is using an array of carbon nanotube electron sources to make an integrated array of RF (radio frequency) sources in a single vacuum envelope. There are several ways of making the RF sources. These were reviewed earlier. Of the different approaches, we believe the best approach for the integrated structure will be to make an array of PTWTs (printed traveling wave tubes).

A PTWT is a TWT fabricated using etched-circuit techniques, costing perhaps $1/10^{th}$ the cost of conventional TWTs or EIKs. The conventional slow-wave beam interaction structures are replaced with flat patterns printed on a ceramic substrate, as is the output/collector structure. The usual PPM or cylindrical magnetics have been replaced with a pair of magnetic sheets with the PPM field magnetized into them. Multiple PTWTs can share the same vacuum envelope. They are suitable for use in an fully-integrated array amplifier system.

The PTWT is an outstanding alternative to the standard TWT, in complexity and cost. For 5–50 watt devices, the PTWT is a forefront competitor over the 2–30 GHz range. Given the low parts count and minimum assembly steps, the PTWT costs approximately one-tenth that of conventional TWTs and EIKs. Further, multiple independent tubes can be located inside the same vacuum envelope, using the same cathode strip and sharing the same magnets. The PTWT has excellent promise as a low cost TWT, with efficiency obtainable on the order of twenty percent. Between two and ten devices can be placed within a single envelope, and the required flat-plate magnets are acceptably small. Available power scales inversely with frequency, from 1,000 watts at 3.3 GHz to 10 watts at 33 GHz. The technology of the present invention leads to higher resolution radar imaging capability than currently exists, and increase penetration in dusty or stormy environments. The goal of the technology is to lead to a low-cost solution for high-frequency phased-array radar applications. Other technologies will benefit from improvements made in carbon nanotube field emission as a result of this invention.

A view of the PTWT array architecture is shown in FIG. 1. The PTWT is a stack of flat, pancake-like structures in which the beam travels from one end to the other. In one embodiment, carbon nanotube material is used as a cold cathode electron source. Other cold cathode electron sources can also be used. This increases efficiency and provides a robust and "instant-on" device. The structure is compact and made of materials that are compatible with vacuum electronic techniques. PTWT Array 101 is the array of PTWT microwave devices (elements). Antenna Array 102 couples the microwave energy from the PTWT Array 101 to the environment outside the tube. Signal and Phase circuitry 104 provide the input signals with specific phases to each of the PTWT microwave elements to control the beam steering. Logic and Control 103 is the interface between the phase array microwave source and human command or commands from other equipment such as missile track equipment.

Figure 2:
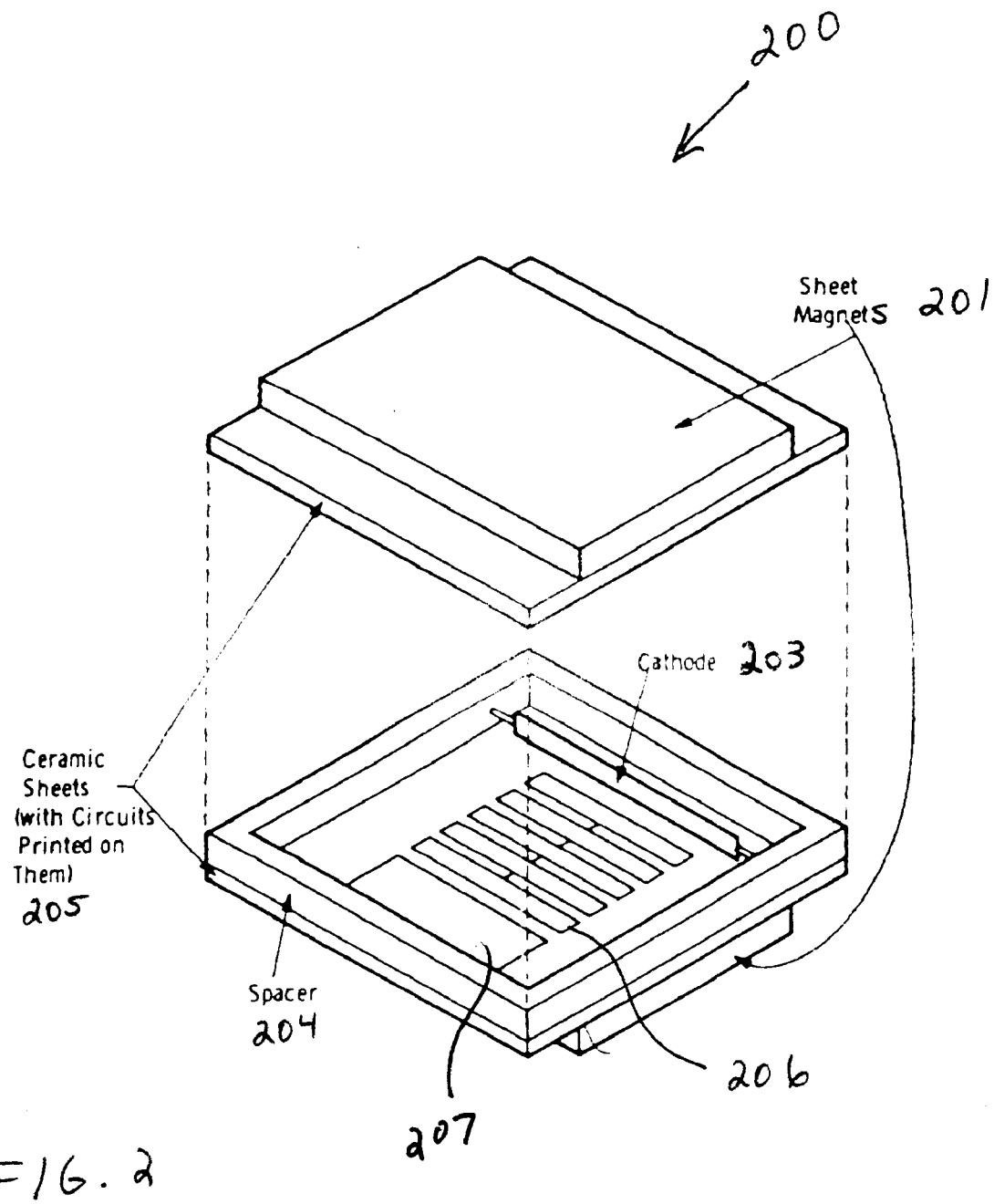

The PTWT is formed using strip-line circuitry on a ceramic base material. It uses a series of printed quarter-wave stubs for the slow-wave structure, which handles both the input and output from the device. FIG. 2 shows an example of a PTWT 200 packaged in a manner similar to a hybrid circuit, using a metal frame ("can"), and consists of 5 components: A pair of ceramic sheets 205 onto which the traveling wave tube slow-wave interaction structure 206 is printed. The microwave output and input matching structures, beam-forming and focusing electrodes 206, and beam collector 207 are also printed. A carbon nanotube cold cathode emitter 203 generates the beam. A metal sealing spacer 204 joins the two ceramic sheets together, forming the vacuum envelope for the PTWT 200. A pair of magnetic sheets 201, located outside the vacuum envelope, are magnetized to provide a periodic magnetic field. The field provides beam compression and focus, across the length of the printed slow-wave interaction structure. Pins (not shown) bring electrical power into the tube, and to bring microwave power in and out.

These few parts replace the several hundred parts that must be manufactured, meticulously brazed, and welded together to form a conventional TWT.

Figure 3:
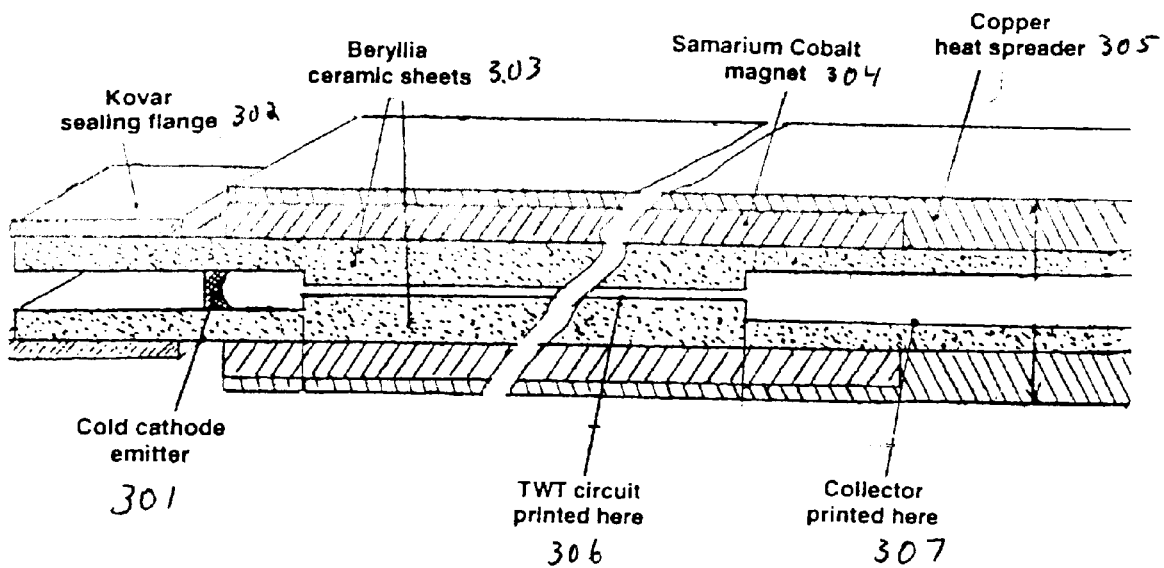

The PTWT's components are shown in another embodiment in FIG. 3 in cross-section.

The cathode 301 that forms the strip electron beam is between ceramic sheets 303 mounted. A kovar sealing flange 302 is brazed to the back side of the ceramic 303.

The vacuum envelope of the tube is completed by TIG-welding a mating part along the edges of the kovar flanges. The printed elements 306, 307 on the ceramic 303 are formed using standard microstrip fabrication techniques. The most common is to coat the ceramic substrate with copper and then photo-etch the pattern.

The PTWT 300 has many significant advantages that allow for a phase array device. For tubes targeted for phased array systems, multiple PTWTs 300 can be printed side-by-side on the same substrate. All tubes 300 will have identical phase characteristics because they are in the same vacuum envelope, and share a common cathode 301 and magnet 304.

Conventional TWTs are focused with an array of ring magnets, alternating with iron pole pieces mounted on the outside of the tube's vacuum envelope. The PTWT 300 achieves the same type of Periodic Pole Magnet (PPM) focusing, but much more economically. The devices can be stacked together with one magnet layer 304 serving devices above and below the magnet 304.

Multiple interaction structures can be connected in parallel to increase the output power of the PTWT 300. The PTWT 300 tube can combine 2 circuits in parallel to double the tube output power. More circuits can be combined for even more power. The individual slow-wave circuits are ¼ wavelengths wide. Therefore, two circuits combined in parallel on a single substrate will be within the ½ wavelength spacing desired for phased array transmitter tubes.

A pair of magnetic sheets 304 is mounted to the backside of each of the ceramic sheets 303 that make up the PTWT. The periodic field is simply magnetized into the magnet 304. The focusing magnets then consist of just two magnetic sheets 304, instead of an assembly of 100 precision-machined parts.

The low cost potential of the PTWT 300 makes it a promising approach for arrayed antenna radar and communications systems. The PTWT 300 coupled with technology advances such as the cold cathode electron emitters 301 and monolithic microwave IC fabrication techniques offer advantages to the original design demonstration.

An exemplary dual tandem, printed circuit TWT may have the following performance characteristics.

| | |
|---|---|
| Frequency Range | 31–35 GHz |
| Saturated Power | 5 Watts |
| Duty Cycle | >10% |
| Saturation Gain | 30 dB |
| Overall Efficiency | 16% |
| Bandwidth | >10% |
| Size | 0.4" × 0.4" × 4.5" long |

The potential of the PTWT is best when used in an array format. Here, several tubes are printed side-by-side on the same substrate, sharing a common cathode, magnet and vacuum envelope. The input signals in each of the interaction structures can be independently phase controlled to provide strong intensity nodes in a large sweep angle.

Figure 4:
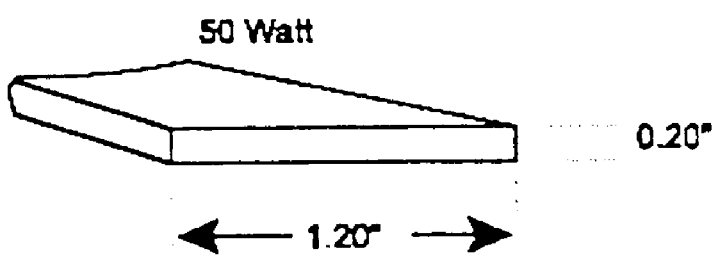

Referring to FIG. 4, one of the many possibilities is to print two circuits side by side to make a 10-Watt tube. This tube would be half of a free-space wavelength wide. Another possibility is to print 10 circuits side by side, with appropriate printed dividing and combining circuits, to provide 50 Watts at 33 GHz.

Figure 5:
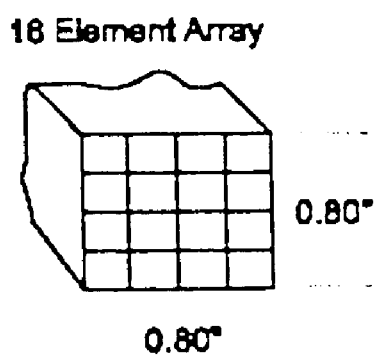

Referring to FIG. 5, yet another option is a tube assembly to feed a 16-element phased array antenna. The assembly would consist of a tube with four double circuits, side by side on a common substrate. Four of these tubes would be stacked. Each individual tube is 0.8" wide by 0.2" high, by 4.5" long. Each of the 16 elements provides 10 Watts (for a total of 160 Watts) across the 31–35 GHz band, with 30 dB gain and 15% overall efficiency. The total unit size is 0.8" by 0.8" by 4.5". The unit is conduction cooled to a pair of base plates.

Figure 6:
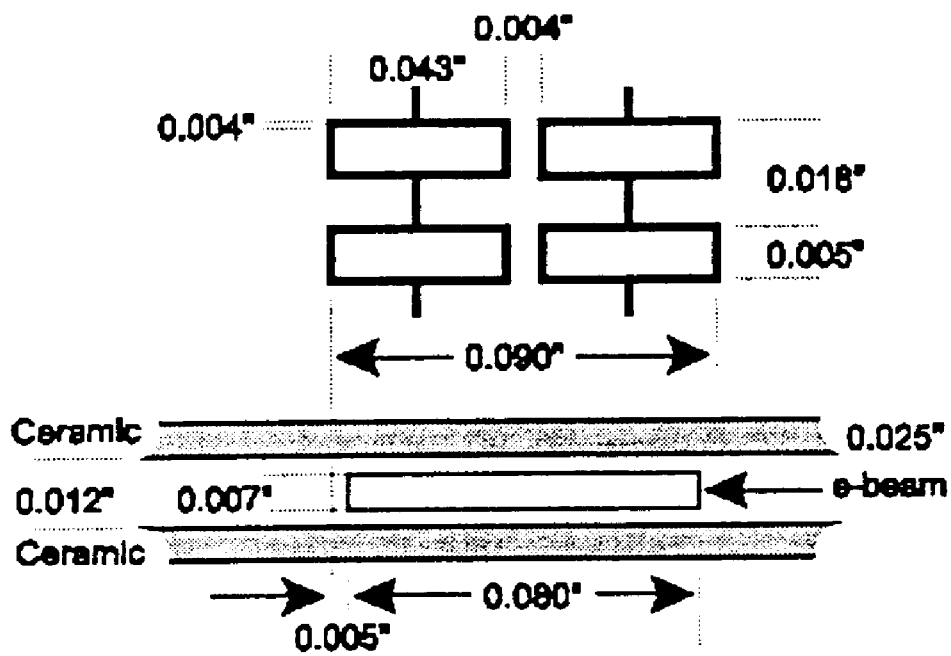

Referring to FIG. 6, to operate at 33 GHz, the printed circuit pattern will have the illustrated dimensions and resultant e-beam size.

What is claimed is:

1. An RF array comprising:
    a first printed traveling wave tube array ("PTWT") comprising:
        first slow wave circuitry printed on a first substrate;
        a first collector printed on the first substrate; and
        a first cold field emission cathode for emitting electrons towards the first slow wave circuitry; and
        an antenna array coupled to the first PTWT.

2. The RF array as recited in claim 1, wherein the first cold field emission cathode comprises carbon nanotubes.

3. The RF array as recited in claim 1, wherein the first PTWT further comprises:
    second slow wave circuitry printed on the first substrate; and
    a second collector printed on the first substrate, wherein the first cold field emission cathode emits electrons towards the second slow wave circuitry.

4. The RF array as recited in claim 1, wherein the RF array operates above 3 GHz.

5. The RF array as recited in claim 3, further comprising a second PTWT comprising:
    third slow wave circuitry printed on a second substrate;
    a third collector printed on the second substrate;
    a second cold field emission cathode for emitting electrons towards the third slow wave circuitry;
    fourth slow wave circuitry printed on the second substrate; and
    a fourth collector printed on the second substrate, wherein the second cold field emission cathode emits electrons towards the fourth slow wave circuitry.

6. The RF array as recited in claim 5, wherein the second PTWT is stacked beneath the first PTWT.

7. A printed traveling wave tube array ("PTWT") comprising:
    first slow wave circuitry printed on a first substrate;
    a first collector printed on the first substrate; and
    a first cold field emission cathode for emitting electrons towards the first slow wave circuitry.

8. The PTWT as recited in claim 7, wherein the first cold field emission cathode comprises carbon nanotubes.

9. The PTWT as recited in claim 8, wherein the first PTWT further comprises:
    second slow wave circuitry printed on the first substrate; and
    a second collector printed on the first substrate, wherein the first cold field emission cathode emits electrons towards the second slow wave circuitry.

10. The PTWT as recited in claim 8, wherein the PTWT operates above 3 GHz.

* * * * *